United States Patent [19]

Jones

[11] Patent Number: 5,621,677
[45] Date of Patent: Apr. 15, 1997

[54] METHOD AND APPARATUS FOR PRECHARGING MATCH OUTPUT IN A CASCADED CONTENT ADDRESSABLE MEMORY SYSTEM

[75] Inventor: Christopher W. Jones, Pleasanton, Calif.

[73] Assignee: Cypress Semiconductor Corp., San Jose, Calif.

[21] Appl. No.: 235,663

[22] Filed: Apr. 29, 1994

[51] Int. Cl.$^6$ .................................................. G11C 15/04
[52] U.S. Cl. ................. 365/49; 365/189.07; 365/189.11; 365/203; 326/114
[58] Field of Search ................................ 365/49, 189.07, 365/189.11, 203, 189.05; 326/114

[56] References Cited

U.S. PATENT DOCUMENTS

| | | | |
|---|---|---|---|
| 4,538,243 | 8/1985 | Zehner | 365/49 |
| 4,694,425 | 9/1987 | Imel | 365/49 |
| 4,808,855 | 2/1989 | Lloyd | 326/86 |
| 4,965,767 | 10/1990 | Kinoshita et al. | 365/49 |
| 5,031,142 | 7/1991 | Castro | 365/49 |
| 5,034,919 | 7/1991 | Sasai et al. | 365/49 |
| 5,047,673 | 9/1991 | Kaneko | 326/86 |
| 5,130,947 | 7/1992 | Reed | 365/227 |
| 5,153,455 | 10/1992 | Walters, Jr. | 326/114 |
| 5,192,879 | 3/1993 | Aoki et al. | 326/87 |
| 5,345,411 | 9/1994 | Yoneda | 365/49 |

FOREIGN PATENT DOCUMENTS

| | | | |
|---|---|---|---|
| 4259115 | 9/1992 | Japan | 326/114 |
| 5191270 | 7/1993 | Japan | 326/114 |

*Primary Examiner*—David C. Nelms
*Assistant Examiner*—Andrew Q. Tran
*Attorney, Agent, or Firm*—Blakely, Sokoloff, Taylor & Zafman LLP

[57] ABSTRACT

A method and apparatus for increasing the speed of a cascaded Content Addressable Memory (CAM) system by pre-charging the system match line of the CAM system are disclosed. The CAM system has (i) a plurality of CAM chips, (ii) a separate match output circuit for each CAM chip, (iii) a separate precharge circuit and pull-down circuit for each match output circuit and (iv) a system match line coupled to all of the match output circuits. Each of the precharge and pull-down circuits has an N-channel MOSFET. To increase the speed of the CAM system, the CAM system precharges the system match line so that the recovery time required for the system match line to change from a logic low to a logic high is minimized. Because each match output circuit has a precharge circuit, adding more CAM chips to the CAM system does not degrade the speed of the CAM system. The method for increasing the speed of the CAM system includes the steps of pre-charging the system match line, tri-stating the system match line and supplying a new match signal to its corresponding pull-down circuit.

19 Claims, 4 Drawing Sheets

| TIME | Pd | COMMENT |
|------|----|---------|
| 1A | PREVIOUS MATCH | ACTIVE |
| 1B | 0 | TRI-STATE |
| 2A | 0 | TRI-STATE |
| 2B | 0 | TRI-STATE |
| 3A | 0 | TRI-STATE |
| 3B | NEW MATCH | ACTIVE |
| 4A | NEW MATCH | ACTIVE |
| 4B | NEW MATCH | ACTIVE |

FIG. 6 (PRIOR ART)

| TIME | Pu | Pd | COMMENT |
|------|----|----|---------|
| 1A | 0 | PREVIOUS MATCH | ACTIVE |
| 1B | 0 | 0 | TRI-STATE |
| 2A | 1 | 0 | PRECHARGE |
| 2B | 1 | 0 | PRECHARGE |
| 3A | 0 | 0 | TRI-STATE |
| 3B | 0 | NEW MATCH | ACTIVE |
| 4A | 0 | NEW MATCH | ACTIVE |
| 4B | 0 | NEW MATCH | ACTIVE |

FIG. 7

METHOD AND APPARATUS FOR PRECHARGING MATCH OUTPUT IN A CASCADED CONTENT ADDRESSABLE MEMORY SYSTEM

BACKGROUND OF THE INVENTION

1. Field of the Invention

The present invention relates to the field of content addressable memories, associative storage, parallel-search storage or the like.

2. Description of the Related Art

FIG. 1 presents a cascaded content addressable memory (CAM) system including a plurality of CAM chips such as CAM 1, CAM 2, CAM 3 through CAM N. CAMs are used in computer data processing where it is desirable to identify the location of the data stored in the memory by specifying part or all of its contents. When a match is found in a CAM chip, the CAM chip sends an output to its match line (such as match/ 1, match/ 2, etc.) indicating that a match is found in that CAM chip. The match output stage of a CAM chip is shown in FIG. 2 in more detail.

FIG. 2 shows a plurality of output stages (80–81) of CAM chips 40–41. Each CAM chip's output stage utilizes an "open drain" implementation for its match/ output, allowing the match/ outputs of a system of cascaded CAM chips to be directly connected. A match/output stage of a CAM chip includes an N-channel MOSFET, a pull-down input signal and a match/ line. For example, CAM chip 40 has (i) an N-channel MOSFET 80, (ii) a pd 1 coupled to the gate of N-channel MOSFET 80 and (iii) a match/ 1 (50) coupled to the drain of N-channel MOSFET 80 and to a system match/ line 63. If any CAM chip has a match, that CAM chip's pd signal becomes a logic high, turning on the corresponding N-channel MOSFET and pulling down system match/ line 63. If none of the CAM chips have a match, then all of the CAM chip's pd signals become a logic low, and system match/ line 63 is pulled high by an external pull-up resistor 60. Therefore, a logic low on system match/ line 63 indicates that one or more CAM chips have a match, and a logic high on system match/ line 63 indicates that no CAM chip in the cascade of CAMs has a match.

The "open drain" implementation shown in FIG. 2 requires a trade-off between the speed of the system and the size of the system due to the RC delay incurred in pulling up system match/ line 63. The RC delay results from external pull-up resistor 60 and the inherent capacitance of the outputs and the connections of the outputs.

A match valid time, tMV 72, and a match recovery time, tMR 71, are shown in FIG. 3 of the timing diagram. Time period tMV 72 includes a time interval between the time when the clock goes low in the third clock cycle of the match instruction and the time when system match/ line 63 is pulled low by one or more of CAM chips 40–41. Time period tMR 71 is a time interval between the time when the clock goes low in the first clock cycle of the match instruction and the time when the system match/ line 63 is pulled high by external pull-up resistor 60. If tMR 71 is greater than tMV 72 plus two clock cycles, then tMR 71 limits the speed of the cascaded CAM system.

The output voltage as it is pulled up by external resistor 60 is given by the equation:

$$Vout = Vol + ([Vcc - Vol] * \{1 - (\exp[-t/(R*Ctot)])\}), \quad (1)$$

where R is the resistance value of external pull-up resistor 60 and Ctot is the total capacitance on system match/ line 63. Ctot is the number of CAM chips in the cascaded system multiplied by the sum of the output capacitance and the board routing capacitance for each chip.

The minimum value of R is determined from the equation:

$$R = (Vcc - Vol)/Iol \quad (2)$$

The minimum match recovery time, tMR 71, is the time t when Vout reaches Voh.

Typical specifications for the parameters that affect the rise time of the output are listed below:

Vcc=5.0 V;

Voh=2.4 V;

Vol=0.5 V;

Iol=30 mA;

$$Cout = 15 \text{ pF (10 pF for an output and 5 pF for the board routing for an output).} \quad (3)$$

With Cout being 15 pF, Ctot=(n * 15 pF), where n is the number of CAM chips in the cascaded system.

From equations (2) and (3), $$R = [(5.0 \text{ V} - 0.5 \text{ V}) / 30 \text{ mA}] = 150 \text{ Ohms} \quad (4)$$

If n is the number of CAM chips in the cascaded system, substituting equations (3) and (4) into equation (1) to find the minimum tMR gives $$2.4 \text{ V} = 0.5 \text{ V} + (4.5 \text{ V} * \{1 - (\exp[-tMR/(150 \text{ Ohms} * n * 15 \text{ pF})])\})$$

Simplifying the above equation further yields tMR=[(n * 2.25 ns) * (ln (26/45))], and it finally yields tMR=n * (1.23 ns).

When tMV 72 is 14 ns, and a clock cycle is 20 ns, only 43 CAM chips can be cascaded before tMR begins to limit the speed of the cascaded system. Any system of CAM chips requiring more than 43 chips is then limited by the "open drain" implementation of the system match/ output.

FIG. 6 shows the states, during 4 clock cycles, of a pd signal and system match/ line 63 (in the comment field of FIG. 6). During a clock period of 1A, the pd signal contains the previous match signal, and system match/ line 63 is active. During the period of 1B, 2A, 2B and 3A, the pd signal is a logic low, so system match/ line 63 is in a tri-state. Depending on how long it takes to pull up system match/ line 63 to a logic high by R 60, this period may consist of more clock cycles. During a period including 3B, 4A and 4B, the pd signal receives a new match signal while system match/ line 63 is active.

The present invention incorporates a precharge circuit so that tMR does not limit the number of CAM chips that can be utilized in a CAM system and the speed of the cascaded CAM system.

SUMMARY OF THE INVENTION

The present invention provides a method and apparatus for increasing the speed of a cascaded Content Addressable Memory (CAM) system by pre-charging the system match line of the CAM system. The CAM system has (i) a plurality of CAM chips, (ii) a separate match output circuit for each CAM chip, (iii) a separate precharge circuit and pull-down circuit for each match output circuit and (iv) a system match line coupled to all of the match output circuits. In one embodiment, each of the precharge and pull-down circuits has an N-channel MOSFET.

To increase the speed of the CAM system, the CAM system precharges the system match line so that the recovery time required for the system match line to change from a logic low to a logic high is minimized. Because each match output circuit has a precharge circuit, adding more CAM chips to the CAM system does not degrade the speed of the CAM system.

The method for increasing the speed of the CAM system includes the steps of pre-charging the system match line, tri-stating the system match line and supplying a new match signal to its corresponding pull-down circuit.

BRIEF DESCRIPTION OF THE DRAWINGS

FIG. 6 presents states of a pull-down signal and the system match/ line in FIG. 2.

FIG. 7 presents states of a pull-up and a pull-down signal and the system match/ line in FIG. 4.

DETAILED DESCRIPTION OF THE PRESENT INVENTION

Figure 4:
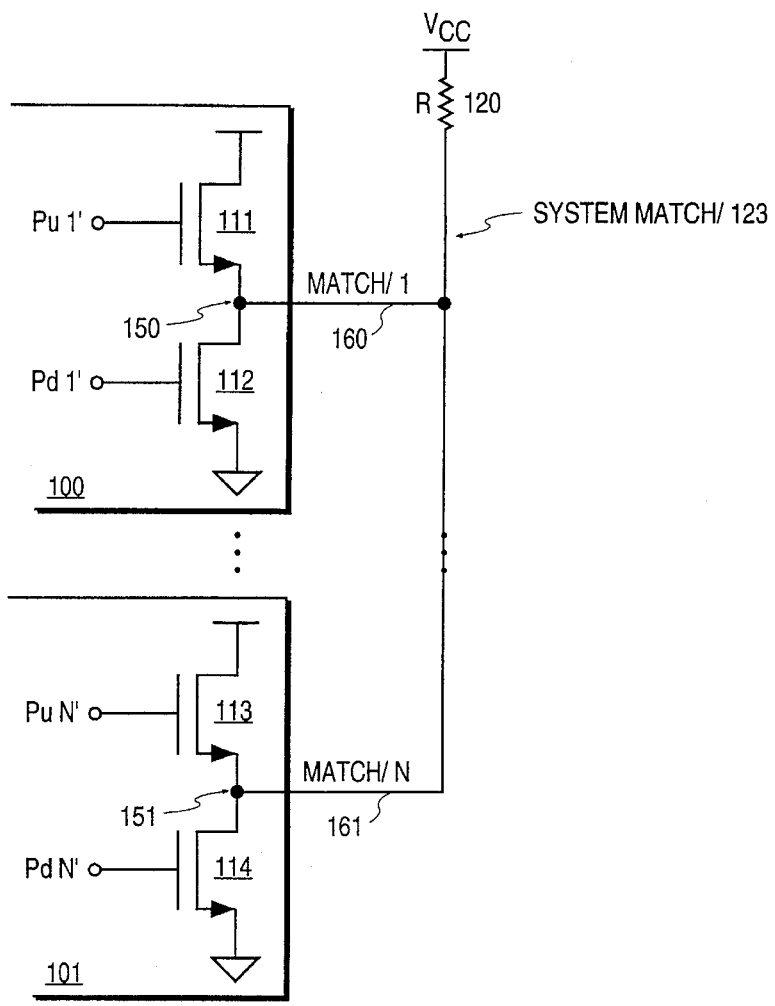
FIG. 4 presents a CAM system according to the present invention wherein each CAM chip incorporates a pull-up and a pull-down circuit in a match output stage.

An implementation of the present invention is illustrated in FIG. 4. A pull-up transistor has been added to each CAM chip's output stage to facilitate pre-charging a system match/ line high. It should be noted that a signal xxx/ is an inverted signal of a signal xxx, and that a circuit designer may denote a signal to be xxx/ or xxx by choice.

Referring to FIG. 4, a cascaded CAM system of the present invention includes CAM chips (100–101) each of which has, in a match output circuit, a pull-up transistor (or a precharge transistor), a pull-down transistor and a match line. For example, the match output circuit of CAM chip 100 includes an N-channel MOSFET 111 for pre-charging a node 150 to a logic high, an N-channel MOSFET 112 for pulling down node 150 to a logic low, and a match/ line 1 (160). In one embodiment, at least one of the match output circuits in the plurality of cascaded CAMs may include both a pre-charge transistor and a pull-down transistor, while one or more of the other match output circuits comprise only a pull-down transistor.

The cascaded CAM system in FIG. 4 further includes (i) a system match/ line 123 which is coupled to all of the individual match lines and (ii) an external pull-up resistor R 120 for maintaining the precharged level, after each of the pull-up transistors precharges system match/ line 123, so that the cascaded CAM system is less susceptible to noise problems on system match/ line 123.

Figure 5:
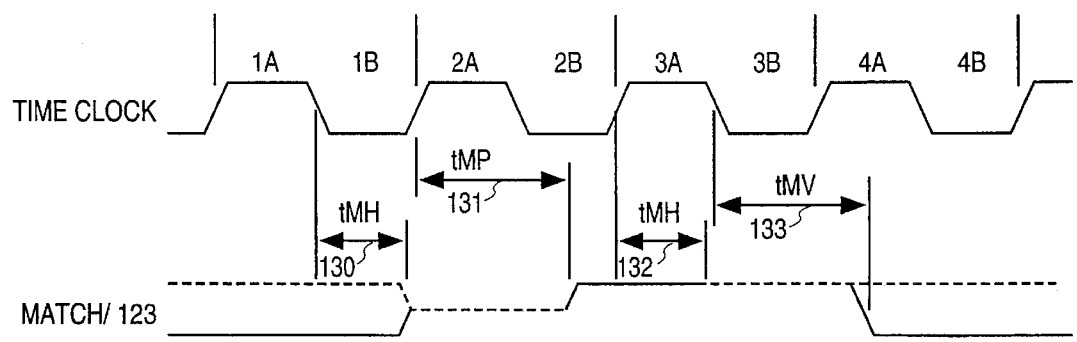
FIG. 5 is a timing diagram of the CAM system in FIG. 4.

Now referring to the timing chart in FIG. 5, during clock cycles 1B and 3A, all of the match/ outputs are tri-stated. This avoids conflict on system match/ line 123 from two or more CAM chips due to the clock skew resulting from the distribution of the system clock to the various CAM chips in the cascaded CAM system.

Figure 1:
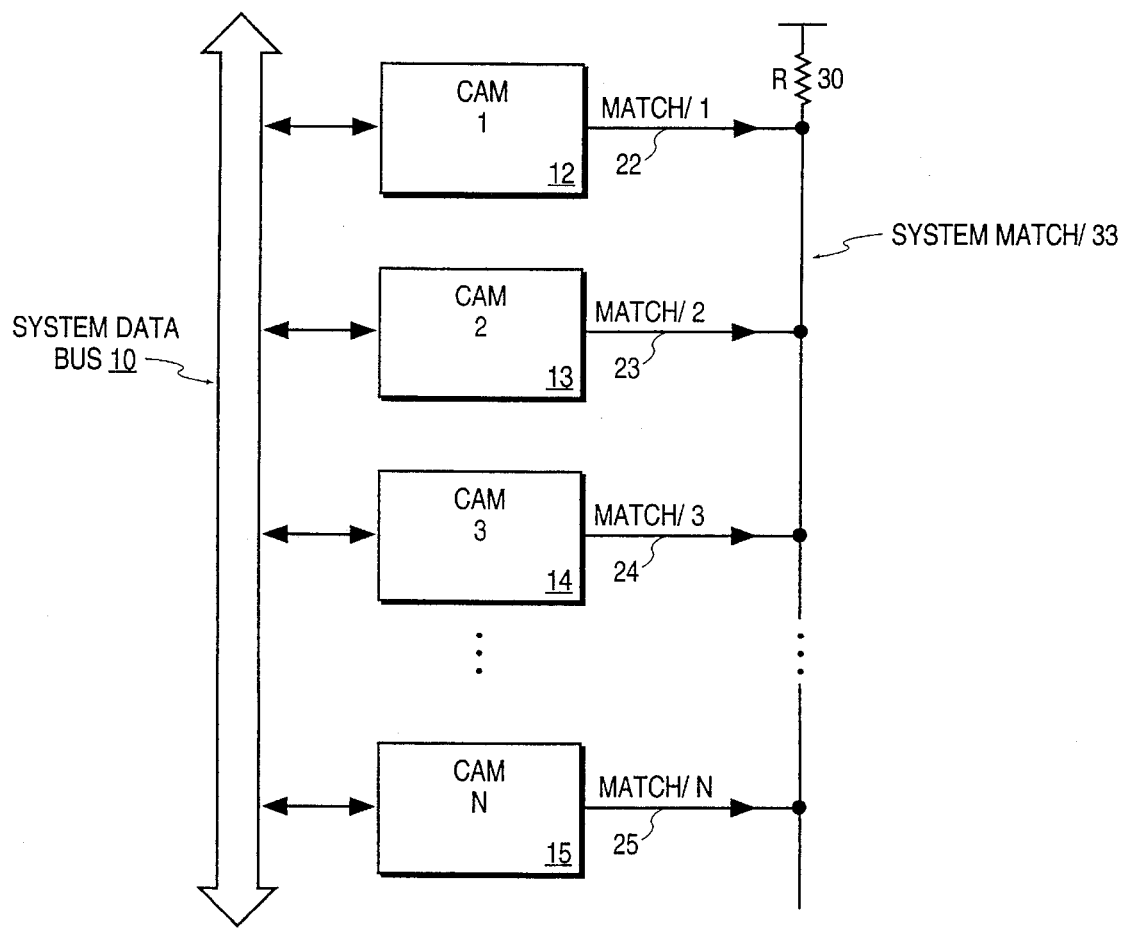
FIG. 1 is a cascaded content addressable memory (CAM) system.
Figure 2:
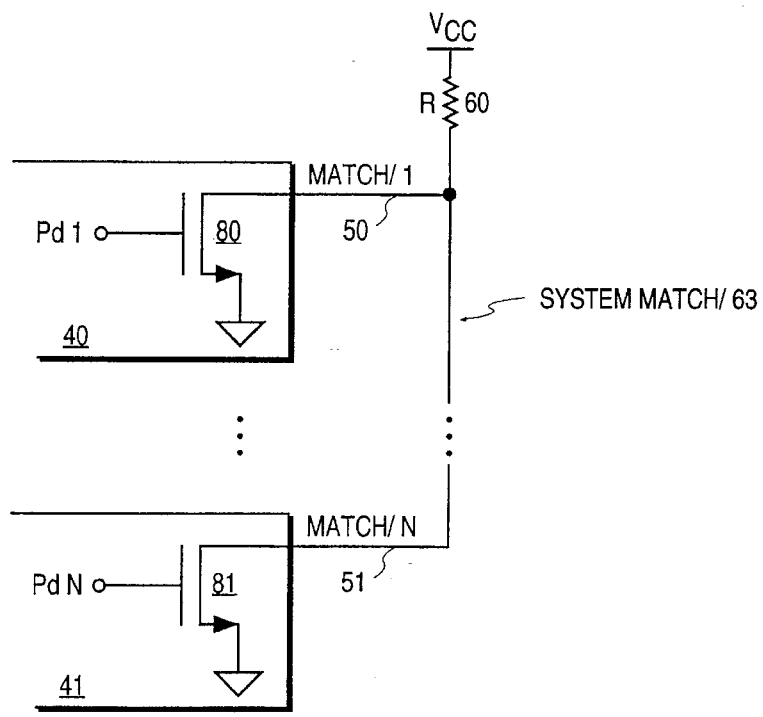
FIG. 2 is a prior art CAM system wherein each CAM chip incorporates an "open drain" implementation in a match output stage.
Figure 3:
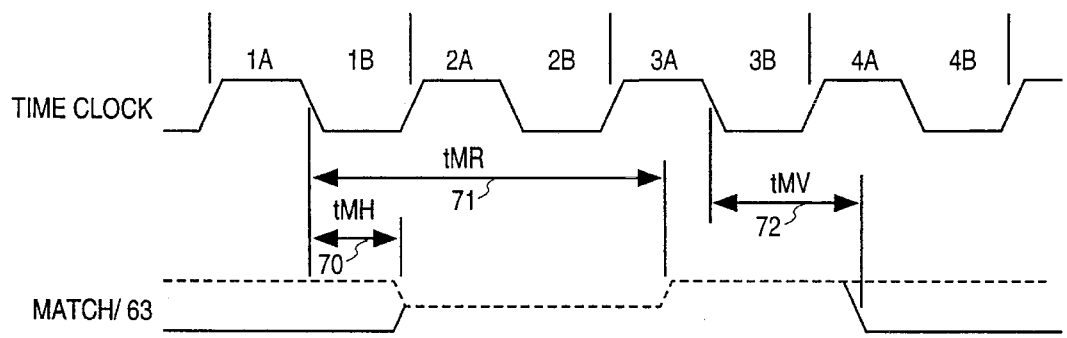
FIG. 3 is a timing diagram of the CAM system in FIG. 2.

In FIG. 5, a match precharge time, tMP 131, is a time period determined by how long it takes for system match/ line 123 to change from Vol to Voh. Because each CAM chip has a precharge transistor that pulls up its match output node, tMP 131 of the present invention is considerably less than tMR 71 of the prior art shown in FIG. 3. Thus, in the prior art, as the number of CAM chips increases, it takes longer to precharge a system match/ line, slowing the speed of the system. In the present invention, on the other hand, the precharge time is independent of the number of CAM chips in the cascaded CAM system.

A match valid time, tMV 133, is still limited by the time required for a single pull-down transistor to pull down system match/ line 123 to Vol. Because an individual pull-up transistor is, in the preferred embodiment of the invention, incorporated in a match output stage of each CAM chip in the present invention, achieving a tMP of 14 ns is accomplished as easily as achieving a tMV of 14 ns. Pre-charging system match/ line 123 in a large cascaded system of CAM chips makes the system faster by allowing the speed of the system to be determined by the match valid time, tMV, as opposed to the match recovery time, tMR.

FIG. 7 presents states of a pull-up and a pull-down signal and system match/ line 123 during the various time periods. FIG. 7 is described in reference to CAM chip 100 and system match/ line 123 in FIG. 4. During a period of 1A, a pull-up signal pu 1' is low so that node 150 is not precharged. A pull-down signal pd 1' is at the previous match signal level. If the previous match signal is high, then transistor 112 is on, pulling down node 150 and system match/ line 123. If, on the other hand, the previous match signal is low, transistor 112 is off. System match/ line 123 is active during period 1A.

During a period of 1B, both pu 1' and pd 1' signals are low to turn off both transistors 111 and 112 so that system match/ line 123 is tri-stated. During the period of 2A and 2B, pu 1' is pulled high, turning on transistor 111 to precharge node 150 and consequently to precharge system match/ line 123. Each pull-up signal of the CAM chips precharges its respective output node and system match/ line 123. During a period of 3A, both pu 1' and pd 1' signals are again low so that system match/ line 123 becomes tri-stated.

During the period of 3B, 4A and 4B, pu 1' is low to turn off transistor 111 and not to precharge the output node 150, and pd 1' receives a new match signal. If the new match signal is high, indicating that a match is found in CAM chip 100, then transistor 112 turns on, pulling down node 150 and system match/ line 123. If the new match signal is low, indicating that no match is found in CAM chip 100, then node 150 stays at the precharged level unless a match is found in another CAM chip.

While the present invention has been particularly described with reference to FIGS. 1 through 7, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. A method for operating a cascaded Content Addressable Memory (CAM) system having (i) a plurality of CAM chips, each of said CAM chips having a separate match output circuit least one of said match output circuits having a precharge circuit and a pull-down circuit and (ii) a system match line coupled to each of said match output circuits and to a load, the method comprising the steps of:

pre-charging said system match line using each of said precharge circuits;

tri-stating said system match line; and supplying of a new match signal to each of said match output circuits.

2. The method according to claim 1 wherein each of said match output circuits has a separate precharge circuit and a separate pull down circuit coupled in series, wherein said new match signal is supplied to each of said pull down circuits.

3. The method according to claim 2 wherein each of said precharge circuits includes a first N-channel MOSFET.

4. The method according to claim 3 wherein each of said pull-down circuits includes a second N-channel MOSFET.

5. The method according to claim 4 wherein when said new match signal is high, a corresponding one of said second N-channel MOSFETS is on, pulling down said system match line.

6. The method according to claim 5 wherein when said new match signal is low, the corresponding one of said second N-channel MOSFETS is off.

7. The method according to claim 4 wherein said cascaded CAM system further includes a resistor, said resistor being coupled to said system match line.

8. The method according to claim 1 further comprising the step of tri-stating said system match line before the step of pre-charging said system match line.

9. A cascaded Content Addressable Memory (CAM) system comprising:

a plurality of CAMs;

each of said CAMs having a corresponding match output circuit for generating a match output on a match line, each of said match output circuits being coupled to a corresponding one of said match lines;

each of said match output circuits having a precharge circuit and a pull-down circuit coupled to a corresponding one of said match lines;

a system match line being coupled to each of said match lines; and a load being coupled to said system match line, said load for coupling to a power supply voltage, wherein each of said pre-charge circuits pre-charges said system match line before said match output circuits receive a new match signal, and wherein said system match line is tri-stated after each of said pre-charge circuits pre-charge said system match line and before said match output circuits receive said new match signal.

10. The cascaded CAM system according to claim 9 wherein each of said precharge circuits includes a first N-channel MOSFET.

11. The cascaded CAM system according to claim 10 wherein each of said pull-down circuits includes a second N-channel MOSFET.

12. The cascaded CAM system according to claim 11 wherein each of said match output circuits includes a pull-up signal, each of said pull-up signals being coupled to a gate of a corresponding one of said first N-channel MOSFETs.

13. The cascaded CAM system according to claim 12 wherein each of said match output circuits includes said new match signal, each of said new match signals being coupled to a gate of a corresponding one of said second N-channel MOSFETs.

14. The cascaded CAM system according to claim 13 further comprising a resistor, said resistor being coupled to said system match line.

15. The cascaded CAM system according to claim 13 wherein when said new match signal is high, one of said second N-channel MOSFETS is on, pulling down said system match line.

16. The cascaded CAM system according to claim 15 wherein when said new match signal is low, said one of said second N-channel MOSFETS is off.

17. The cascaded CAM system according to claim 16 wherein when said pull-up signals are high, each of said first N-channel MOSFETs is on, pre-charging said system match line.

18. The cascaded CAM system according to claim 17 wherein when said pull-up signals are low, each of said first N-channel MOSFETs is off.

19. The cascaded CAM system according to claim 9 wherein said system match line is tri-stated before each of said precharge circuits precharges said system match line.

* * * * *